(12) United States Patent
Kuo et al.

(10) Patent No.: US 12,156,336 B2
(45) Date of Patent: Nov. 26, 2024

(54) ELECTRONIC DEVICE

(71) Applicant: Advanced Semiconductor Engineering, Inc., Kaohsiung (TW)

(72) Inventors: Chiung-Ying Kuo, Kaohsiung (TW); Hung-Chun Kuo, Kaohsiung (TW); Pao-Nan Lee, Kaohsiung (TW); Jung Jui Kang, Kaohsiung (TW); Chang Chi Lee, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 332 days.

(21) Appl. No.: 17/856,898

(22) Filed: Jul. 1, 2022

(65) Prior Publication Data

US 2024/0008184 A1    Jan. 4, 2024

(51) Int. Cl.
*H05K 1/18* (2006.01)
*H05K 1/02* (2006.01)

(52) U.S. Cl.
CPC .......... *H05K 1/181* (2013.01); *H05K 1/0216* (2013.01); *H05K 1/028* (2013.01)

(58) Field of Classification Search
CPC ....... H05K 1/181; H05K 1/0216; H05K 1/028
USPC ....................................................... 361/749
See application file for complete search history.

(56) References Cited

U.S. PATENT DOCUMENTS

| | | | |
|---|---|---|---|
| 6,924,551 B2 | 8/2005 | Rumer et al. | |
| 8,198,716 B2 | 6/2012 | Periaman et al. | |
| 9,666,539 B1 * | 5/2017 | Li | ............ H01L 23/49822 |
| 10,236,209 B2 | 3/2019 | Sharan et al. | |
| 2021/0050327 A1 | 2/2021 | Shih | |

OTHER PUBLICATIONS

U.S. Appl. No. 17/555,227, filed Dec. 17, 2021, Chang et al.

* cited by examiner

*Primary Examiner* — Binh B Tran
(74) *Attorney, Agent, or Firm* — FOLEY & LARDNER LLP

(57) ABSTRACT

An electronic device is disclosed. The electronic device includes a carrier including a first portion, a second portion over the first portion, and a third portion connecting the first portion and the second portion. The electronic device also includes a first electronic component disposed between the first portion and the second portion. An active surface of the first electronic component faces the second portion. The electronic device also includes a second electronic component disposed over the second portion. The first portion is configured to transmit a first power signal to a backside surface of the first electronic component opposite to the active surface.

20 Claims, 11 Drawing Sheets

ELECTRONIC DEVICE

BACKGROUND

1. Field of the Disclosure

The present disclosure relates to an electronic device, and in particular to an electronic device having an electronic component and a power regulator.

2. Description of the Related Art

An interconnect component (such as a substrate, an interposer and a printed circuit board (PCB)) may bridge components and provide electrical connections among the same. Conventionally, power signals and electrical signals (such as high-speed signals) are transmitted through the same surface (i.e., the active surface) of a component. Therefore, input/output (I/O) pins carrying electrical signals may be occupied and limited. In addition, power regulating devices require passive components, such as inductors and capacitors. To adapt to demands of high-speed data communication, more passive components are needed, and parasitic effects exhibited from the passive components may affect electronic performance of the high-speed circuitry.

SUMMARY

In some embodiments, an electronic device includes a carrier including a first portion, a second portion over the first portion, and a third portion connecting the first portion and the second portion. The electronic device also includes a first electronic component disposed between the first portion and the second portion. An active surface of the first electronic component faces the second portion. The electronic device also includes a second electronic component disposed over the second portion. The first portion is configured to transmit a first power signal to a backside surface of the first electronic component opposite to the active surface.

In some embodiments, an electronic device includes a carrier including a first portion, a second portion over the first portion, and a third portion connecting the first portion and the second portion. The electronic device also includes a first electronic component disposed between the first portion and the second portion and disposed on a side of the third portion. The first electronic component comprises a first region and a second region between the first region and the third portion. The first region is configured to provide a non-power path between the first electronic component and an external device, and the second region is configured to provide a power path.

In some embodiments, an electronic device includes a carrier including a first rigid portion, a second rigid portion over the first rigid portion, and a flexible portion connecting between the first rigid portion and the second rigid portion. The electronic device also includes a first electronic component disposed between the first rigid portion and the second rigid portion. A backside surface of the first electronic component faces the first rigid portion. The electronic device also includes a second electronic component disposed over the second rigid portion. The first rigid portion is configured to transmit a first power signal and to transmit a second power signal to the backside surface of the first electronic component, the second power signal being generated by regulating the first power signal. The second rigid portion is configured to transmit a third power signal and to transmit a fourth power signal to the second electronic component, the fourth power signal being generated by regulating the third power signal.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1A:
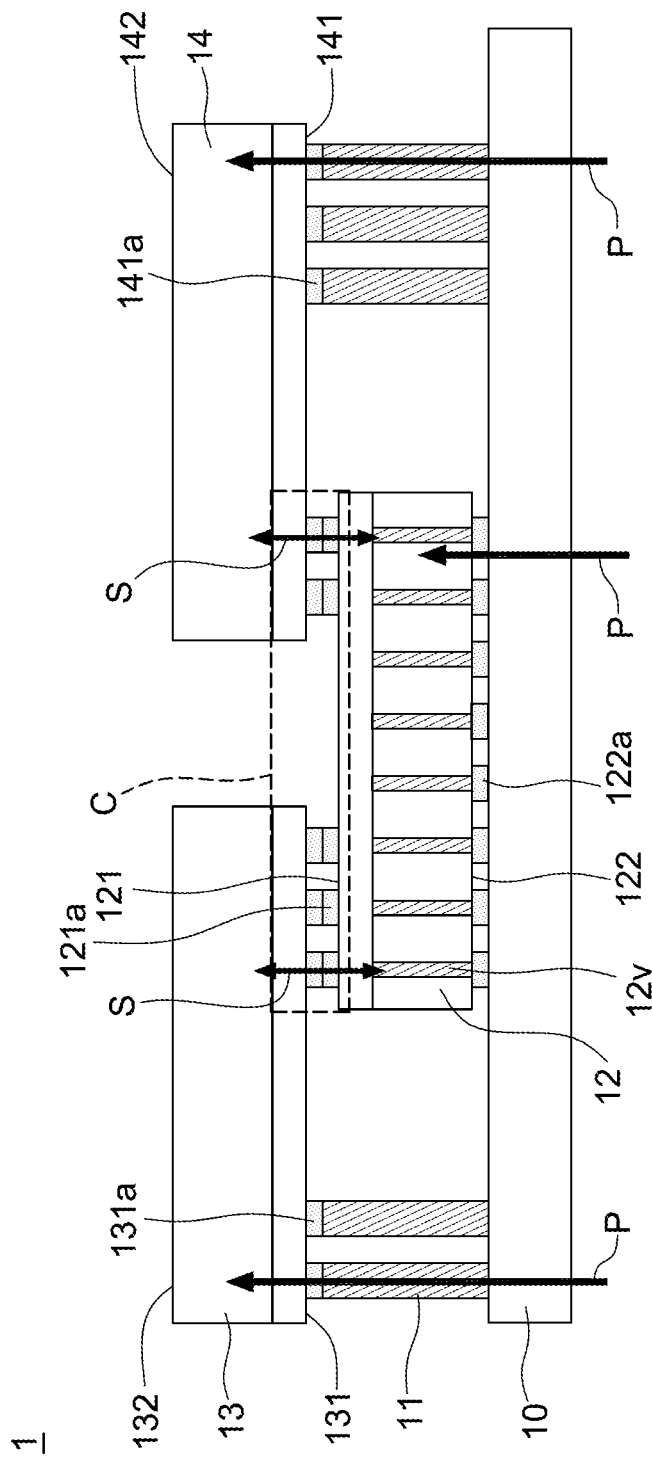
FIG. 1A is a cross-section of an exemplary electronic device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1A is a cross-section of an exemplary electronic device 1 according to some embodiments of the present disclosure. In some embodiments, the electronic device 1 may include a package, such as a semiconductor device package. In some embodiments, the electronic device 1 may include a carrier 10, one or more conductive elements 11 and electronic components 12, 13, 14.

In some embodiments, the carrier 10 may include, for example, a printed circuit board (PCB), such as a paper-based copper foil laminate, a composite copper foil laminate, or a polymer-impregnated glass-fiber-based copper foil laminate. In some embodiments, the carrier 10 may include an interconnection structure, such as a redistribution layer (RDL) and/or a grounding element.

The carrier 10 may include one or more conductive pads (not shown) in proximity to, adjacent to, or embedded in and exposed by one or more surfaces of the carrier 10. The conductive pads may be configured for electrical connections, including, for example, the power routing path (or the power path) and the non-power routing path (or the non-power path) in the electronic device 1.

As used herein, a power path may refer to a path dedicated to power supply connections. Additionally, a non-power path may refer to a path through which a non-power signal may be transmitted. Non-power signal may include analog signals, digital signals, clock signals or other electrical signals other than power signals.

The conductive element 11 may be disposed on the carrier 10 and spaced apart from the electronic component 12. In some embodiments, the conductive element 11 may include a conductive via or a conductive pillar. In some embodiments, the conductive element 11 may include conductive materials, such as copper (Cu), tin (Sn), aluminum (Al), gold (Au), silver (Ag), tungsten (W), nickel (Ni), or other suitable materials. In some embodiments, the conductive elements 11 may surround one or more lateral surfaces of the electronic component 12.

There may be one or more conductive elements 11 connected between the carrier 10 and the electronic component 13. Similarly, there may be one or more conductive elements 11 connected between the carrier 10 and the electronic component 14. The location and number of the conductive elements 11 in the electronic device 1 are not intended to limit the present disclosure. For example, the number of the conductive elements 11 connected between the carrier 10 and the electronic component 13 may be greater, less, or equal to the number of the conductive elements 11 connected between the carrier 10 and the electronic component 14.

The electronic component 12 may be disposed on the carrier 10. In some embodiments, the electronic component 12 may include a surface 121 facing away from the carrier 10 and a surface 122 (which is opposite to the surface 121) facing the carrier 10. The surface 121 may include an active surface and the surface 122 may include a backside surface or a rear surface.

In some embodiments, the electronic component 12 may be electrically connected with the carrier 10 by way of flip-chip or wire-bond techniques. In some embodiments, the electronic component 12 may be electrically connected to the carrier 10 through electrical contacts 122a on the surface 122. In some embodiments, the electronic component 12 may be electrically connected to the electronic component 13 and the electronic component 14 through electrical contacts 121a on the surface 121.

In some embodiments, the electronic component 12 may include one or more conductive vias 12v. In some embodiments, the conductive via 12v may extend between the surface 121 and the surface 122. In some embodiments, the conductive via 12v may electrically connect with the carrier 10 through the electrical contact 122a. In some embodiments, each of the conductive via 12v may be substantially aligned with a corresponding one of the electrical contacts 122a. In some embodiments, each of the conductive via 12v may be substantially aligned with a corresponding one of the electrical contacts 121a.

The electronic component 13 may be disposed on the conductive element 11 and the electronic component 12. In some embodiments, the electronic component 13 may include a surface 131 facing the carrier 10 and a surface 132 (which is opposite to the surface 131) facing away from the carrier 10. The surface 131 may include an active surface and the surface 132 may include a backside surface.

In some embodiments, the electronic component 13 may be electrically connected to the conductive element 11. In some embodiments, the electronic component 13 may be electrically connected to the electronic component 12 through an electrical contact 131a on the surface 131 and the electrical contact 121a on the surface 121 of the electronic component 12. In some embodiments, the electrical connection between the electronic component 13 and the electronic component 12 may be obtained by solder bonding, Cu-to-Cu bonding, or hybrid bonding.

Similar to the electronic component 13, the electronic component 14 may be disposed on the conductive element 11 and the electronic component 12. In some embodiments, the electronic component 14 may include a surface 141 facing the carrier 10 and a surface 142 (which is opposite to the surface 141) facing away from the carrier 10. The surface 141 may include an active surface and the surface 142 may include a backside surface.

In some embodiments, the electronic component 14 may be electrically connected to the conductive element 11. In some embodiments, the electronic component 14 may be electrically connected to the electronic component 12 through an electrical contact 141a on the surface 141 and the electrical contact 121a on the surface 121 of the electronic component 12. In some embodiments, the electrical connection between the electronic component 14 and the electronic component 12 may be obtained by solder bonding, Cu-to-Cu bonding, or hybrid bonding.

In some embodiments, the electronic components 12, 13 and 14 may each include an active device or an active component. In some embodiments, the electronic components 12, 13 and 14 may each be or include circuits or circuit elements that rely on an external power supply to control or modify electrical signals.

In some embodiments, the electronic components 12, 13, and 14 may each include a processor, a controller, a memory, or an input/output (I/O) buffer, etc. More specifically, the electronic component 12 may include, for example, a central processing unit (CPU), a microprocessor unit (MPU), a graphics processing unit (GPU), a microcontroller unit (MCU), an application-specific integrated circuit (ASIC), a field-programmable gate array (FPGA), or another type of integrated circuits (ICs). The electronic component 13 may include, for example, a non-volatile memory (such as a flash memory and a read-only memory (ROM)) or a volatile memory (such as a Dynamic Random Access Memory (DRAM)). The electronic component 14 may include, for example, a radio frequency (RF) IC or another component for wireless transmission. For example, an ASIC may be disposed on the carrier 10, and a memory and an RF IC may be disposed or stacked on the ASIC.

The location and number of the electronic components in the electronic device 1 are not intended to limit the present disclosure. For example, the ASIC and the memory may be stacked on the RF IC. Otherwise, the ASIC and the RF IC may be stacked on the memory. Also, there may be any number of electronic components in the electronic device 1 based on design requirements.

In some embodiments, an electrical signal may be transmitted between the active surface (e.g., the surface 121) of the electronic component 12 and the active surface (e.g., the surface 131) of the electronic component 13. For example, a non-power path "S" may pass through the surfaces 121 and 131. The non-power path S may be configured to transmit an electrical signal between the electronic component 12 and the electronic component 13. In some embodiments, the non-power path S may be free from passing through the carrier 10. For example, the communication (such as high-speed communication) between the electronic component 12 and the electronic component 13 may be completed or achieved without another interconnect component (such as a substrate, an interposer, a PCB or a bridge component).

Similarly, an electrical signal may be transmitted between the active surface (e.g., the surface 121) of the electronic component 12 and the active surface (e.g., the surface 141) of the electronic component 14. For example, a non-power path "S" may pass through the surfaces 121 and 141. The non-power path S may be configured to transmit an electrical signal between the electronic component 12 and the electronic component 14. In some embodiments, the non-power path S may be free from passing through the carrier 10. For example, the communication (such as high-speed communication) between the electronic component 12 and the electronic component 14 may be completed or achieved without another interconnect component (such as a substrate, an interposer, a PCB or a bridge component).

In other words, a circuit region or an interconnection region "C" (indicated in FIG. 1A by a dashed box) may be formed between the active surface (e.g., the surface 121) of the electronic component 12 and the active surface (e.g., the surface 131) of the electronic component 13, and between the active surface (e.g., the surface 121) of the electronic component 12 and the active surface (e.g., the surface 141) of the electronic component 14. The circuit region C may be configured to provide, define, construct, or establish the one or more non-power paths S. The circuit region C may include a high-speed circuitry region and/or a high-density circuitry region. For example, the circuit density of the circuit region C may be relatively higher than that of the other circuit regions of the electronic device 1. For example, the line spacing and/or the pad pitch of the circuit region C may be relatively narrower than that of the other circuit regions of the electronic device 1.

In some embodiments, the surface 131 of the electronic component 13 may include a first region connecting to the electronic component 12 and a second region connecting to the conductive element 11. The line spacing and/or the pad pitch (such as the pad pitch of the electrical contact 131a) in the first region of the surface 131 may be less than that in the second region of the surface 131. In some embodiments, the surface 141 of the electronic component 14 may include a first region connecting to the electronic component 12 and a second region connecting to the conductive element 11. The line spacing and/or the pad pitch (such as the pad pitch of the electrical contact 141a) in the first region of the surface 141 may be less than that in the second region of the surface 141.

In some embodiments, the electronic component 13 and the electronic component 14 may be electrically connected or communicated with each other through the circuit region C. In some embodiments, the electronic component 13 and the electronic component 14 may be electrically connected or communicated with each other through the surface 121 of the electronic component 12. For example, one or more conductive traces (such as the conductive traces 121c in FIG. 1B) may be configured to connect the electronic component 13 and the electronic component 14. For example, an electrical signal (or a non-power signal) may be transmitted between the active surface (e.g., the surface 131) of the electronic component 13 and the active surface (e.g., the surface 131) of the electronic component 13 through the active surface (e.g., the surface 121) of the electronic component 12.

The carrier 10 may provide power and/or ground connections to the electronic components 12, 13 and 14. For example, the carrier 10 may have a connector or terminal configured to electrically connect with a power source and/or a power regulating device (not illustrated in FIG. 1A).

For example, the carrier 10 may be configured to provide, define, construct, or establish a power path "P" for transmitting a power signal (from the power source or the power regulating device) to the backside surface (e.g., the surface 122) of the electronic component 12. For example, the backside surface (e.g., the surface 122) of the electronic component 12 may be configured to receive a power signal while the active surface (e.g., the surface 121) of the electronic component 12 may be configured to receive an electronic signal.

For example, the carrier 10 and the conductive element 11 may be configured to provide, define, construct, or establish a power path "P" for transmitting a power signal to the active surface (e.g., the surface 131) of the electronic component 13. For example, a part of the active surface (e.g., the surface 131) of the electronic component 13 may be configured to receive a power signal while another part (e.g., a part in the circuit region C) may be configured to receive an electronic signal.

For example, the carrier 10 and the conductive element 11 may be configured to provide, define, construct, or establish a power path "P" for transmitting a power signal to the active surface (e.g., the surface 141) of the electronic component 14. For example, a part of the active surface (e.g., the surface 141) of the electronic component 14 may be configured to receive a power signal while another part (e.g., a part in the circuit region C) may be configured to receive an electronic signal.

In some other embodiments, the conductive element 11 may be configured to provide, define, construct, or establish a non-power path. For example, a non-power signal may be transmitted between the active surface (e.g., the surface 131) of the electronic component 13 and carrier 10 through the conductive element 11. In some other embodiments, the conductive element 11 may be configured to provide, define, construct, or establish a non-power path. For example, a non-power signal may be transmitted between the active surface (e.g., the surface 141) of the electronic component 14 and carrier 10 through the conductive element 11.

In some other embodiments, a power signal from the carrier 10 to the active surface (e.g., the surface 131) of the electronic component 13 may be transmitted through the backside surface (e.g., the surface 122) of the electronic component 12, the conductive via 12 and the active surface (e.g., the surface 121) of the electronic component 12. Similarly, a power signal from the carrier 10 to the active surface (e.g., the surface 141) of the electronic component 14 may be transmitted through the backside surface (e.g., the surface 122) of the electronic component 12, the conductive via 12 and the active surface (e.g., the surface 121) of the electronic component 12. In such embodiments, power paths may pass through the circuit region C. In such embodiments, power paths may pass through active surface (e.g., the surface 131) of the electronic component 13 and the active surface (e.g., the surface 121) of the electronic component 12 without another interconnect component (such as a substrate, an interposer, a PCB or a bridge component). Similarly, in such embodiments, power paths may pass through active surface (e.g., the surface 141) of the electronic component 14 and the active surface (e.g., the surface 121) of the electronic component 12 without another interconnect component.

In a comparative embodiment, components or chips may be side-by-side or packaged through a Package-on-Package (PoP) technology. An interconnect component (such as a substrate, an interposer, a PCB or a bridge component) may be used to connect active surfaces of the components. Power signals and electrical signals are transmitted through the active surfaces. Therefore, I/O pins for carrying electrical signals may be occupied and limited. In addition, the transmission of the electrical signals may be adversely impacted by parasitic effects exhibited from passive components in the power paths.

According to some embodiments of the present disclosure, by directly connecting the electronic components face-to-face, the non-power path can be shorter than if connecting the electronic components through an interconnect component (such as a substrate, an interposer, a PCB or a bridge component).

In addition, a power signal may be transmitted to the electronic component 12 through the backside surface (e.g., the surface 122) without consuming I/O pins on the surface 121 of the electronic component 12. Thus, more I/O pins can be used to transmit an electronic signal in the circuit region C. The circuit region C may be disposed farther from the power signal and the impact from parasitic effects may be reduced. All in all, package size can be miniaturized, signal propagation delay reduced, and electronic performance improved.

Figure 1B:
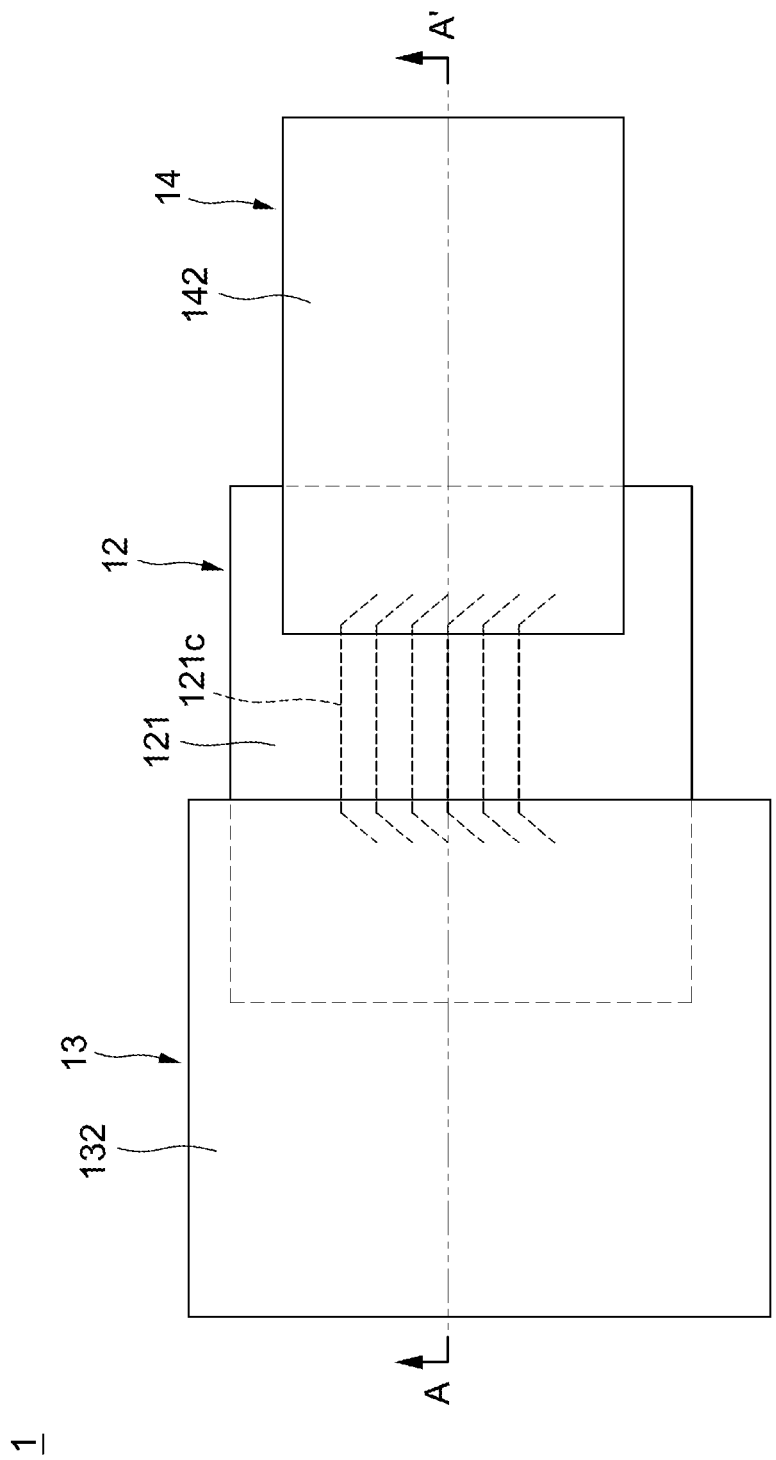
FIG. 1B is a top view of an exemplary part of an electronic device according to some embodiments of the present disclosure.

FIG. 1B is a top view of an exemplary part of an electronic device according to some embodiments of the present disclosure. In some embodiments, the electronic device 1 in FIG. 1A may have a top view as shown in FIG. 1B. In some embodiments, the electronic device in FIG. 1B along the line A-A' may have a cross-section as shown in FIG. 1A.

From a top view as shown in FIG. 1B, a surface area of the electronic component 13 may be greater than a surface area of the electronic component 12. A surface area of the electronic component 12 may be greater than a surface area of the electronic component 14.

A width of the electronic component 13 may be greater than a width of the electronic component 12. A width of the electronic component 12 may be greater than a width of the electronic component 14.

Figure 2:
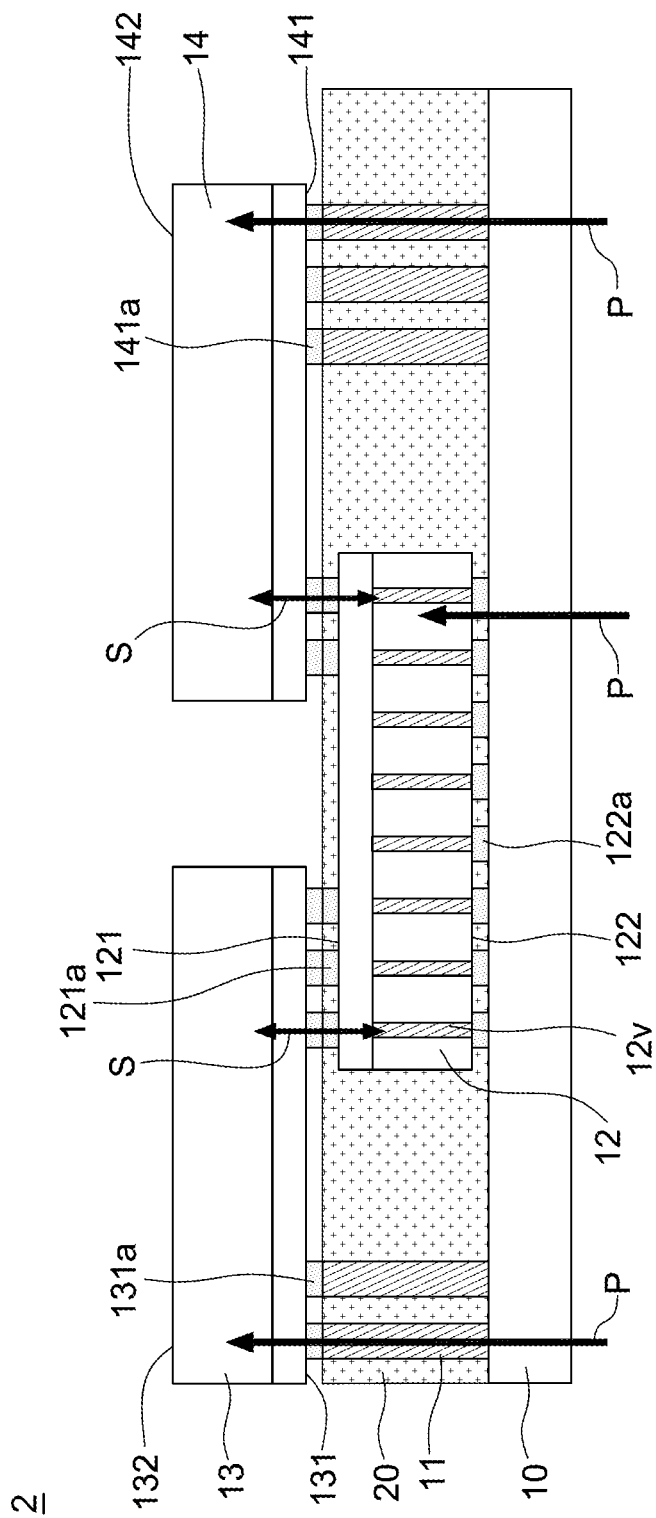
FIG. 2 is a cross-section of an exemplary electronic device according to some embodiments of the present disclosure.

FIG. 2 is a cross-section of an exemplary electronic device 2 according to some embodiments of the present disclosure. The electronic device 2 is similar to the electronic device 1 in FIG. 1A, with differences therebetween as follows.

The electronic device 2 further includes an encapsulant 20. In some embodiments, the encapsulant 20 may include an epoxy resin having fillers, a molding compound (e.g., an epoxy molding compound or another molding compound), a polyimide, a phenolic compound or material, a material with a silicone dispersed therein, or a combination thereof.

The encapsulant 20 may be disposed on the carrier 10 and cover, encapsulate or surround the electronic component 12. One or more electrical contacts 121a on the active surface (e.g., the surface 121) of the electronic component 12 may be exposed from the encapsulant 20.

The conductive element 11 may penetrate the encapsulant 20. For example, the conductive element 11 may be surrounded or partially covered by the encapsulant 20. A part of each of the conductive element 11 may be exposed from the encapsulant 20. In some embodiments, the encapsulant 20 may be configured to support and protect the conductive element 11.

The electronic component 13 may be disposed on the encapsulant 20 and electrically connected with the electrical contacts 121a and the conductive elements 11 exposed from the encapsulant 20. The electronic component 14 may be disposed on the encapsulant 20 and electrically connected with the electrical contacts 121a and the conductive elements 11 exposed from the encapsulant 20.

Figure 3:
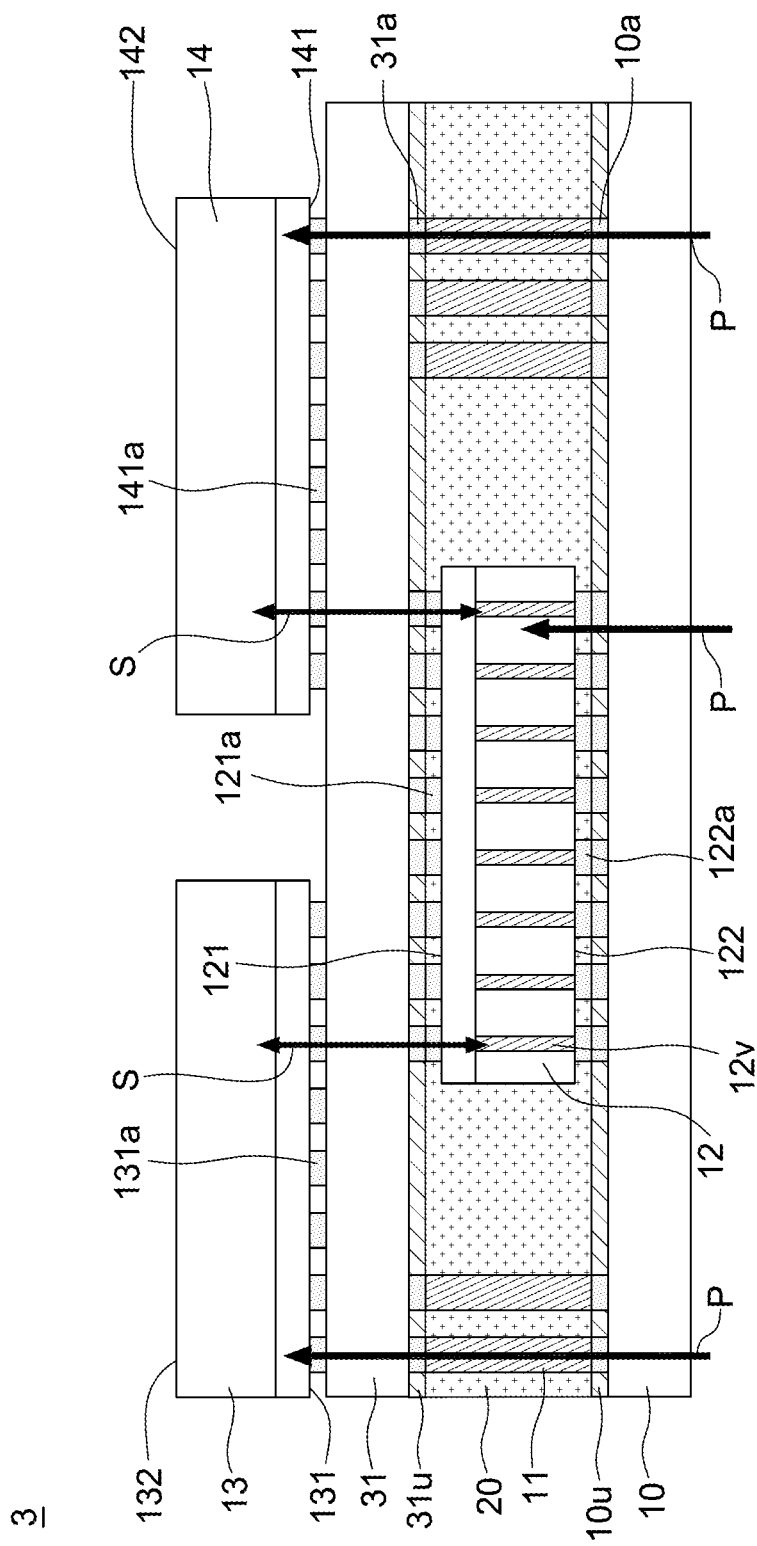
FIG. 3 is a cross-section of an exemplary electronic device according to some embodiments of the present disclosure.

FIG. 3 is a cross-section of an exemplary electronic device 3 according to some embodiments of the present disclosure. The electronic device 3 is similar to the electronic device 1 in FIG. 1A, with differences therebetween as follows.

The electronic device 3 further includes the encapsulant 20 and an interconnection structure 31. Some detailed descriptions of the encapsulant 20 may refer to the corresponding preceding paragraphs and are not repeated hereinafter for conciseness.

The conductive element 11 may penetrate the encapsulant 20. The conductive element 11 may connect between the carrier 10 and the interconnection structure 31. The conductive element 11 may connect between a conductive pad 10a on the carrier 10 and a conductive pad 31a on the interconnection structure 31. An underfill 10u may be disposed between the encapsulant 20 and the carrier 10. An underfill 31u may be disposed between the encapsulant 20 and the interconnection structure 31.

The interconnection structure 31 may be disposed on the electronic component 12. The interconnection structure 31 may include an interposer or include interposer-like wiring to form a structure which may be regarded as an interposer or a fan-out substrate. In some embodiments, the interconnection structure 31 may include, for example, silicon (Si), glass or other suitable materials. The interconnection structure 31 may include a conductive via (such as a Through-Silicon Via (TSV)) and/or an RDL. The interconnection structure 31 may be configured to provide a lateral routing path for connecting more electronic components to the electronic component 12.

In some embodiments, the interconnection structure 31 may be configured to provide, define, construct, or establish the one or more non-power paths S between the active surface (e.g., the surface 121) of the electronic component 12 and the active surface (e.g., the surface 131) of the electronic component 13, and between the active surface (e.g., the surface 121) of the electronic component 12 and the active surface (e.g., the surface 141) of the electronic component 14. In some embodiments, the interconnection structure 31 may include a high-speed circuitry region and/or a high-density circuitry region.

In some embodiments, the carrier 10, the conductive element 11 and the interconnection structure 31 may be configured to provide, define, construct, or establish a power path P for transmitting a power signal to the active surface (e.g., the surface 131) of the electronic component 13. For example, the interconnection structure 31 may be configured to receive a power signal from the conductive element 11 and transmit the power signal to the electronic component 13.

In some embodiments, the carrier 10, the conductive element 11 and the interconnection structure 31 may be configured to provide, define, construct, or establish a power path P for transmitting a power signal to the active surface (e.g., the surface 141) of the electronic component 14. For example, the interconnection structure 31 may be configured to receive a power signal from the conductive element 11 and transmit the power signal to the electronic component 14.

FIG. 4 is a cross-section of an exemplary electronic device 4 according to some embodiments of the present disclosure. The electronic device 4 is similar to the electronic device 1 in FIG. 1A, with differences therebetween as follows.

The conductive element 11 of the electronic device 1 is replaced with an interconnection structure 40. The interconnection structure 40 may be disposed on the carrier 10 and may be electrically connected with the carrier 10 through an electrical contact 40a. The interconnection structure 40 may surround the electronic component 12. The interconnection structure 40 may include a frame board or a ring board. The interconnection structure 40 may define a space or a hole for accommodating the electronic component 12.

An electronic component 41 may be disposed on the electronic component 12 and the interconnection structure 40. The electronic component 41 may be similar to the electronic components 13 and 14 in FIG. 1A. Therefore, some detailed descriptions may refer to the corresponding preceding paragraphs and are not repeated hereinafter for conciseness.

In some embodiments, an electrical signal may be transmitted between the active surface (e.g., the surface 121) of the electronic component 12 and an active surface (e.g., the surface 411) of the electronic component 41. For example, a non-power path S may pass through the surfaces 121 and 411. The non-power path S may be configured to transmit an electrical signal between the electronic component 12 and the electronic component 41.

In some embodiments, the carrier 10 and the interconnection structure 40 may be configured to provide, define, construct, or establish a power path P for transmitting a power signal to the active surface (e.g., the surface 411) of the electronic component 41. For example, the interconnection structure 40 may be configured to receive a power signal from the carrier 10 and transmit the power signal to the electronic component 41.

Figure 4A:
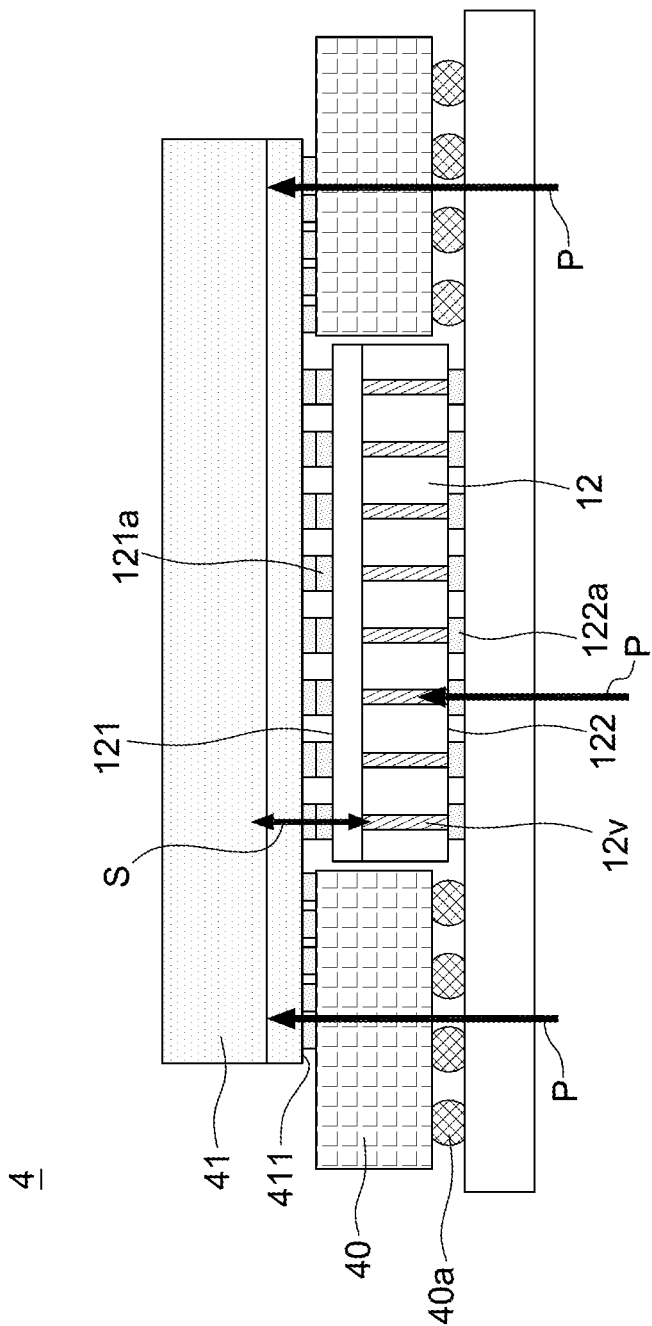
FIG. 4A is a cross-section of an exemplary electronic device according to some embodiments of the present disclosure.
Figure 4B:
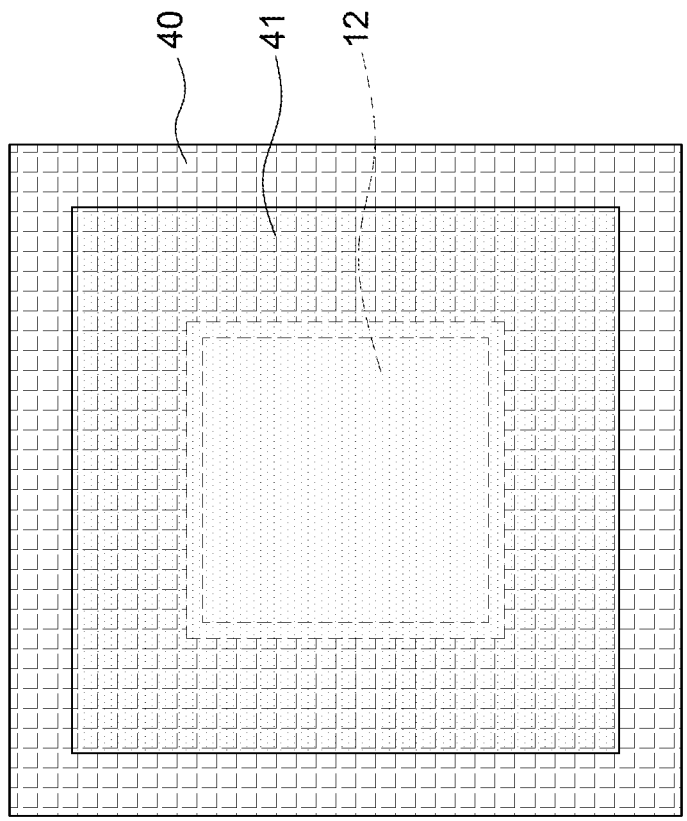
FIG. 4B is a top view of an exemplary part of an electronic device according to some embodiments of the present disclosure.

FIG. 4B is a top view of an exemplary part of an electronic device according to some embodiments of the present disclosure. In some embodiments, the electronic device 4 in FIG. 4A may have a top view as shown in FIG. 4B. In some embodiments, the electronic device in FIG. 4B may have a cross-section as shown in FIG. 4A.

The electronic component 12 may be disposed in a space or a hole defined by the interconnection structure 40. The electronic component 41 may be disposed on the interconnection structure 40 to cover the electronic component 12.

In some embodiments, the interconnection structure 40 may provide power paths surrounding one or more lateral surfaces of the electronic component 12.

Figure 5A:
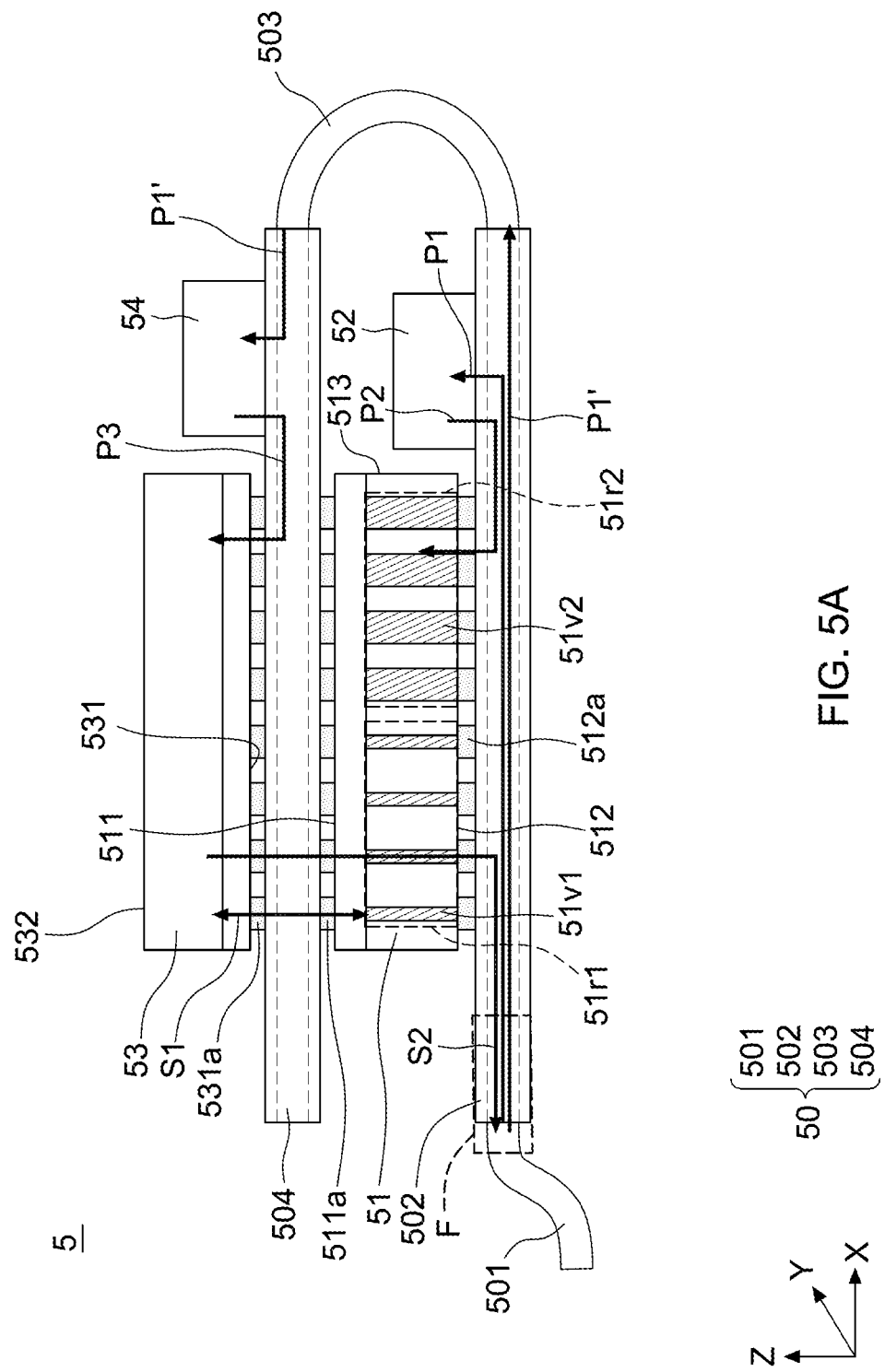
FIG. 5A is a cross-section of an exemplary electronic device according to some embodiments of the present disclosure.

FIG. 5A is a cross-section of an exemplary electronic device 5 according to some embodiments of the present disclosure. In some embodiments, the electronic device 5 may include a package, such as a semiconductor device package. In some embodiments, the electronic device 5 may include a carrier 50, electronic components 51, 53, and power regulating devices 52, 54.

The carrier 50 may include portions 501, 502, 503, and 504. The portion 502 may be connected between the portions 501 and 503. The portion 503 may be connected between the portions 502 and 504. The portion 503 may be curved, bent or folded. The portion 504 may be disposed over the portion 502. The portions 504 and 502 may at least partially overlap along the Z-axis.

The portions 501, 502, 503 and 504 may include a flexible printed circuit board or a flexible substrate. The flexible printed circuit board may be exposed in the portions 501 and 503. The portions 502 and 504 are where the flexible printed circuit board is covered or surrounded by a supporting layer. Therefore, a thickness of the portion 503 may be respectively less than a thickness of the portion 502 and a thickness of the portion 504. In some embodiments, the flexible printed circuit board in the portions 502 and 504 may be sandwiched by two supporting layers. In some other embodiments, the flexible printed circuit board in the portions 502 and 504 may be surrounded by a cladding layer.

In some embodiments, the supporting layer or the cladding layer in the portions 502 and 504 may include a polymeric material, such as an epoxy resin having fillers, a molding compound (e.g., an epoxy molding compound or other molding compound), a polyimide, a phenolic compound or material, a material with a silicone dispersed therein, or a combination thereof.

In some embodiments, the portions 502 and 504 may be more rigid than the portions 501 and 503. In some embodiments, a Young's modulus of the portions 502 and 504 may be greater than a Young's modulus of the portions 501 and 503. In some embodiments, the portions 502 and 504 may provide structural support for the electronic components 51 and 53, and power regulating devices 52 and 54. In some embodiments, the portions 502 and 504 may include rigid portions. The portions 501 and 503 may include flexible or bendable portions In some embodiments, the portion 501 may be configured to electrically connect with a power source or a power supply (not illustrated). The carrier 50 may provide a power path between the power supply and the power regulating device (such as one of the power regulating devices 52 and 54), which in turn may provide regulated power to the electronic components (such as one of the electronic components 51 and 53) electrically connected with the carrier 50.

The electronic component 51 may be disposed on or disposed over the portion 502. The electronic component 51 may be disposed between the portions 502 and 504. In some embodiments, the electronic component 51 may include a surface 511 facing the portion 504, a surface 512 (which is opposite to the surface 511) facing the portion 502, and a surface (or a lateral surface) 513 extending between the surface 511 and 512. The surface 511 may include an active surface and the surface 512 may include a backside surface. The portion 503 may extend from an elevation lower than the surface 512 to an elevation higher than the surface 511. The portion 503 may laterally cover the surface 513 of the electronic component 51.

The portion 503 may extend between an imaginary line parallel to the surface 511 and an imaginary line parallel to the surface 512. The portion 503 may exceed over an imaginary line parallel to the surface 511. The portion 503 may exceed over an imaginary line parallel to the surface 512. The portion 503 may be configured to function as a shielding structure. For example, the portion 503 may be configured to provide an electromagnetic interference (EMI) protection to prevent the electronic component 51 from being interfered by other electronic components, and vice versa.

In some embodiments, the electronic component 51 may be electrically connected with the portions 502 and 504 by way of flip-chip or wire-bond techniques. In some embodiments, the electronic component 51 may be electrically connected to the portion 502 through an electrical contact 512a on the surface 512. In some embodiments, the electronic component 51 may be electrically connected to the portion 504 through an electrical contact 511a on the surface 511.

In some embodiments, the electronic component 51 may include one or more conductive vias 51v1 and 51v2. In some embodiments, the conductive vias 51v1 and 51v2 may extend between the surface 511 and the surface 512. In some embodiments, the conductive vias 51v1 and 51v2 may partially penetrate the electronic component 51. In some embodiments, a dimension (such as a width or a diameter) of each of the conductive vias 51v1 may be less than a dimension (such as a width or a diameter) of each of the conductive vias 51v2.

In some embodiments, the conductive vias 51v1 and 51v2 may electrically connect with the portion 502 through the electrical contact 512a. In some embodiments, each of the conductive vias 51v1 and 51v2 may be substantially aligned with a corresponding one of the electrical contacts 512a. In some embodiments, each of the conductive vias 51v1 and 51v2 may be substantially aligned with a corresponding one of the electrical contacts 511a.

The electronic component 53 may be disposed on or disposed over the portion 504. In some embodiments, the electronic component 53 may include a surface 531 facing the portion 504 and a surface 532 (which is opposite to the surface 531) facing way from the portion 504. The surface 531 may include an active surface and the surface 532 may include a backside surface.

In some embodiments, the electronic component 53 may be electrically connected with the portion 504 by way of flip-chip or wire-bond techniques. In some embodiments, the electronic component 53 may be electrically connected to the portion 504 through an electrical contact 531a on the surface 531.

The electronic components 51 and 53 may each be similar to the electronic components 12, 13, and 14 in FIG. 1A. Therefore, some detailed descriptions may refer to the corresponding preceding paragraphs and are not repeated hereinafter for conciseness.

The portion 504 may be disposed between the electronic components 51 and 53. The portion 504 may be configured to provide a non-power path "S1" between the electronic components 51 and 53 for transmitting an electrical signal (e.g., analog signals, digital signals, clock signals or other electrical signals other than power signals) therebetween. For example, an electrical signal may be transmitted between the active surface (e.g., the surface 511) of the electronic component 51 and the active surface (e.g., the surface 531) of the electronic component 53 through the non-power path S1.

The electronic components 51 and 53 may be at least partially overlapped with each other vertically (or along a direction substantially perpendicular to a surface of the portion 504 on which the electronic component 53 is disposed). For example, the electronic components 51 and 53 may at least partially overlap along the Z-axis. As such, the non-power path S1 between the electronic components 51 and 53 may be substantially along the Z-axis. Therefore, the non-power path S1 can be short and signal propagation delay can be reduced.

In some embodiments, the portion 504 may include a high-speed circuitry region and/or a high-density circuitry region as the circuit region C in FIG. 1A. For example, the circuit density of the portion 504 may be relatively higher than that of the other portions of the carrier 50. For example, the line spacing and/or the pad pitch of the portion 504 may be relatively narrower than that of the other portions of the carrier 50.

The portions 501, 502, the conductive vias 51v1, and the portion 504 may be configured to provide a non-power path "S2" between the electronic component 53 and an external component or device (such as another electronic device connected with the portion 501) for transmitting an electrical signal therebetween. For example, an electrical signal may be transmitted between the active surface (e.g., the surface 531) of the electronic component 53 and the external component through the non-power path S2.

In some embodiments, an external component or device (such as another electronic device connected with the portion 501) may be electrically connected with the active surface (e.g., the surface 511) of the electronic component 51 through the portions 501, 502, 503 and 504. Therefore, an electrical signal may be transmitted between the active surface (e.g., the surface 511) of the electronic component 51 and the external component through the portions 501, 502, 503 and 504.

In some embodiments, an external component or device (such as another electronic device connected with the portion 501) may be electrically connected with the active surface (e.g., the surface 531) of the electronic component 53 through the portions 501, 502, 503 and 504. Therefore, an electrical signal may be transmitted between the active surface (e.g., the surface 531) of the electronic component 53 and the external component through the portions 501, 502, 503 and 504.

The power regulating device 52 may be disposed on the portion 502. The power regulating device 52 and the electronic component 51 may be disposed on the same side or the same surface of the portion 502. For example, the power regulating device 52 may be disposed between the portions 502 and 504.

The power regulating device 52 may be configured to receive a power signal from a power source through the portions 501 and 502, as indicated by the power path "P1." The power regulating device 52 may regulate the power signal and provide a regulated power signal to the electronic component 51 through the portion 502, as indicated by the power path "P2."

In some embodiments, the electronic component 51 may be disposed closer to the power source (which may be connected with the portion 501) than the power regulating device 52. In other words, the power regulating device 52 may be disposed farther from the power source than the electronic component 51. The power path P1 may extend from a periphery of the portion 501, across the backside surface (e.g., the surface 512) of the electronic component 51, and to the power regulating device 52.

It is noted that the portion 501 may electrically connect to a power source (which corresponds to the power paths P1 and P1') and an external component or device (which corresponds to the non-power path S2). Grounding paths may be arranged around the non-power path S2 to reduce electromagnetic interference from the power paths P1 and P1'. However, in some other embodiments, the power source (which corresponds to the power paths P1 and P1') and the external component or device (which corresponds to the non-power path S2) may connect with different portions. For example, two physically separated portions may be connected with the portions 502 and may be respectively configured to provide the power path(s) and the non-power path(s).

As shown in FIG. 5A, the distance between the portion 501 and the electronic component 51 (e.g., the length of the non-power path S2) may be shorter than the distance between the portion 501 and the power regulating device 52 (e.g., the length of the power path P1). The I/O pins for the power regulating device 52 may be spaced apart from the non-power path S2 to reduce electromagnetic interference from the power path P1.

In some embodiments, the electronic component 51 may include a first region 51r1 and a second region 51r2. The second region 51r2 may be disposed between the first region 51r1 and the portion 503. The conductive vias 51v1 may be disposed in the first region 51r1 and the conductive vias 51v2 may be disposed in the second region 51r2.

In some embodiments, the first region 51r1 may be configured to provide a non-power path for transmitting a non-power signal. For example, the first region 51r1 may be configured to provide a non-power path between the electronic component 51 and an external component. For example, the first region 51r1 may be configured to provide a non-power path (such as the non-power path S1) between the electronic component 51 and the electronic component 53. For example, the first region 51r1 may be configured to provide a non-power path (such as the non-power path S2) between the electronic component 51 and the portion 502. For example, the electronic component 53 and the portion 502 may be communicated through the first region 51r1 of the electronic component 51.

In some embodiments, the second region 51r2 may be configured to provide a power path for transmitting a power signal. For example, the second region 51r2 may be configured to provide a power path (such as the non-power path P2) between the electronic component 51 and the portion 502. For example, the second region 51r2 may be configured to provide a power path between the electronic component 53 and the portion 502.

In some embodiments, the portion 502 may include a first region corresponding to the first region 51r1 and configured to provide a non-power path for transmitting a non-power signal. In some embodiments, the portion 502 may include a second region corresponding to the second region 51r2 and configured to provide a power path for transmitting a power signal.

The power regulating device 54 may be disposed on the portion 504. The power regulating device 54 and the electronic component 53 may be disposed on the same side or the same surface of the portion 504. The power regulating device 54 may be configured to receive a power signal from a power source through the portions 501, 502, 503 and 504, as indicated by the power path "P1'." The power regulating device 54 may regulate the power signal and provide a regulated power signal to the electronic component 53 through the portion 504, as indicated by the power path "P3."

In some embodiments, the power regulating devices 52 and 54 may each include a power management integrated circuit (PMIC). In some embodiments, the power regulating devices 52 and 54 may each include a voltage regulator, such as a linear regulator (which is configured to maintain a constant output voltage) or a switching regulator (which is configured to generate an output voltage higher than or lower than the input voltage). In some embodiments, the power regulating devices 52 and 54 may each include a step-down (buck) converter, a step-up (boost) converter, an analog-to-digital converter, a digital-to-analog converter, an AC-DC converter, a DC-DC converter, other types of converters, or a combination thereof.

The positions and number of the power regulating devices in the electronic device 5 are not intended to limit the present disclosure. For example, there may be any number of power regulating devices in the electronic device 5 due to design requirements.

Figure 5B:
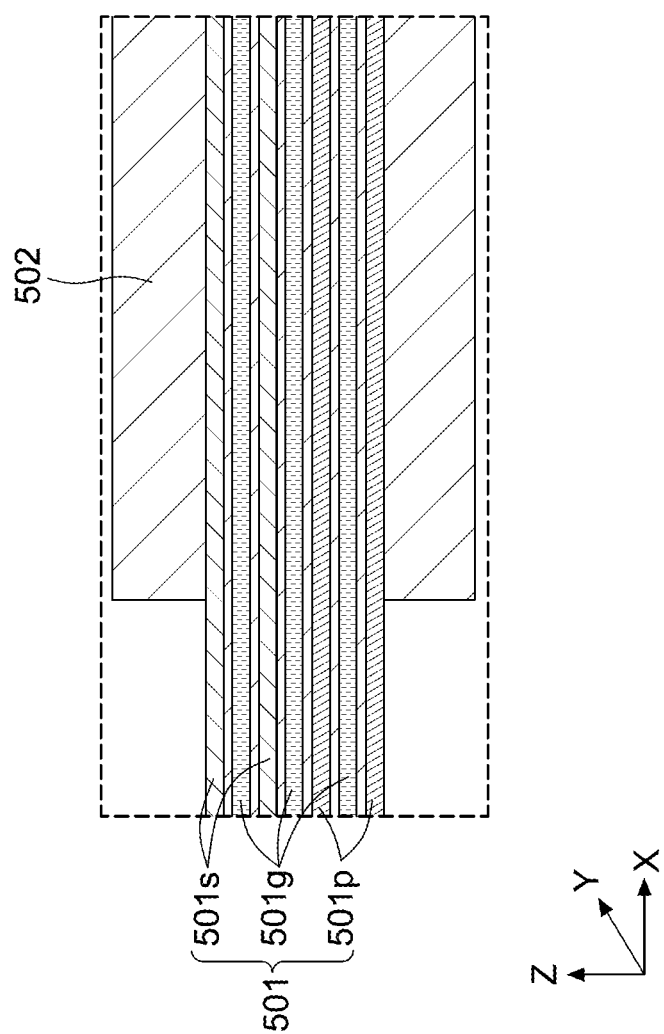
FIG. 5B is a cross-section of an exemplary part of an electronic device according to some embodiments of the present disclosure.

FIG. 5B is a cross-section of an exemplary part of an electronic device according to some embodiments of the present disclosure. In some embodiments, an interface "F" between the portions 501 and 502 in FIG. 1A may have an enlarged cross-section as shown in FIG. 5B.

A flexible printed circuit board or a flexible substrate may include one or more non-power paths 501s, one or more power paths 501p and one or more grounding paths 501g. The flexible printed circuit board may include a multi-layered wiring structure. The flexible printed circuit board may include a plurality of layers stacked along the Z-axis. Each of the non-power paths 501s, the power paths 501p and the grounding paths 501g may be provided by one layer of the flexible printed circuit board.

The flexible printed circuit board extends between the portions 501 and 502. The flexible printed circuit board in the portion 502 may be sandwiched by two supporting layers to increase rigidity.

The non-power paths 501s may be similar to the non-power path S2 in FIG. 5A and may be configured to transmit an electrical signal (e.g., analog signals, digital signals, clock signals or other electrical signals other than power signals) between the backside surface (e.g., the surface 512) of the electronic component 51 and an external component.

The power paths 501p may be similar to the power paths P1 and P1' in FIG. 5A and may be configured to transmit a power signal to the power regulating device 52 and to transmit a power signal to the power regulating device 54 through the portion 503.

In some embodiments, the grounding paths 501g may be disposed between two adjacent paths of the non-power paths 501s and the power paths 501p to reduce electrical interference.

The non-power paths 501s and the power paths 501p are disposed at different elevations along the Z-axis. For example, when the electronic component 51 and the power regulating device 52 are disposed on the portion 502 as shown in FIG. 5A, the non-power paths 501s may be closer to the electronic component 51 and the power regulating device 52 than the power paths 501p.

For example, the upper portion of the flexible printed circuit board may include a wiring structure configured to provide non-power paths and the lower portion of the flexible printed circuit board may include a wiring structure configured to provide power paths.

As such, the non-power paths 501s between the backside surface (e.g., the surface 512) of the electronic component 51 and an external component can be short.

Figure 5C:
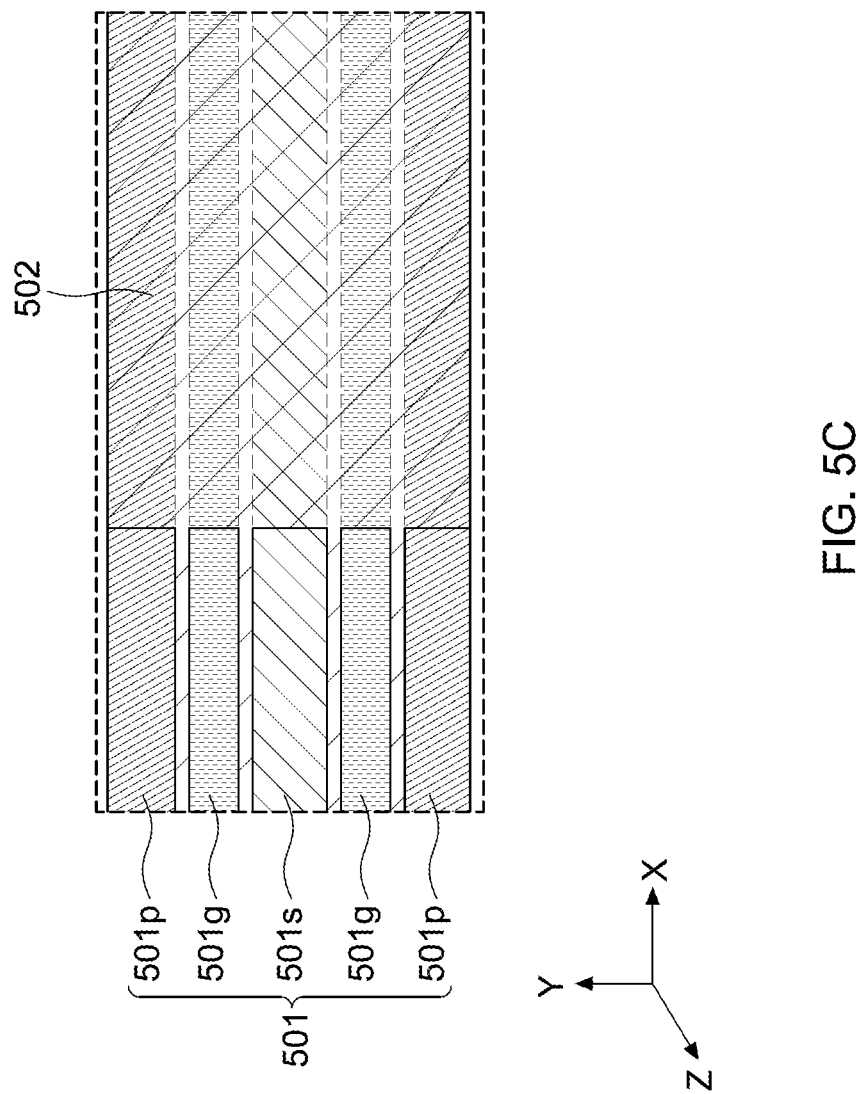
FIG. 5C is a top view of an exemplary part of an electronic device according to some embodiments of the present disclosure.

FIG. 5C is a cross-section of an exemplary part of an electronic device according to some embodiments of the present disclosure. In some embodiments, an interface "F" between the portions 501 and 502 in FIG. 1A may have an enlarged top view as shown in FIG. 5C. It is to be noted that FIG. 5C represents a structure different from the structure shown in FIG. 5B.

A flexible printed circuit board or a flexible substrate may include the non-power path 501s, the power paths 501p and the grounding paths 501g. The flexible printed circuit board may also include a multi-layered structure as in FIG. 5A. However, in some other embodiments, the flexible printed circuit board may include a single or monolithic layer. Each of the non-power path 501s, the power paths 501p and the grounding paths 501g may be provided by the one single layer. Therefore, the thickness of the carrier 50 may be reduced.

The flexible printed circuit board extends between the portions 501 and 502. The flexible printed circuit board in the portion 502 may be sandwiched by two supporting layers to increase rigidity. From a top view in FIG. 5C, a part of the flexible printed circuit board in the portion 502 is covered by the supporting layer.

The non-power path 501s may be disposed between the power paths 501p. The grounding path 501g may be disposed between the non-power path 501s and an adjacent one power path 501p to reduce electrical interference. The non-power path 501s can be isolated from the power paths 501p through the grounding paths 501g to reduce unwanted noise.

Figure 6:
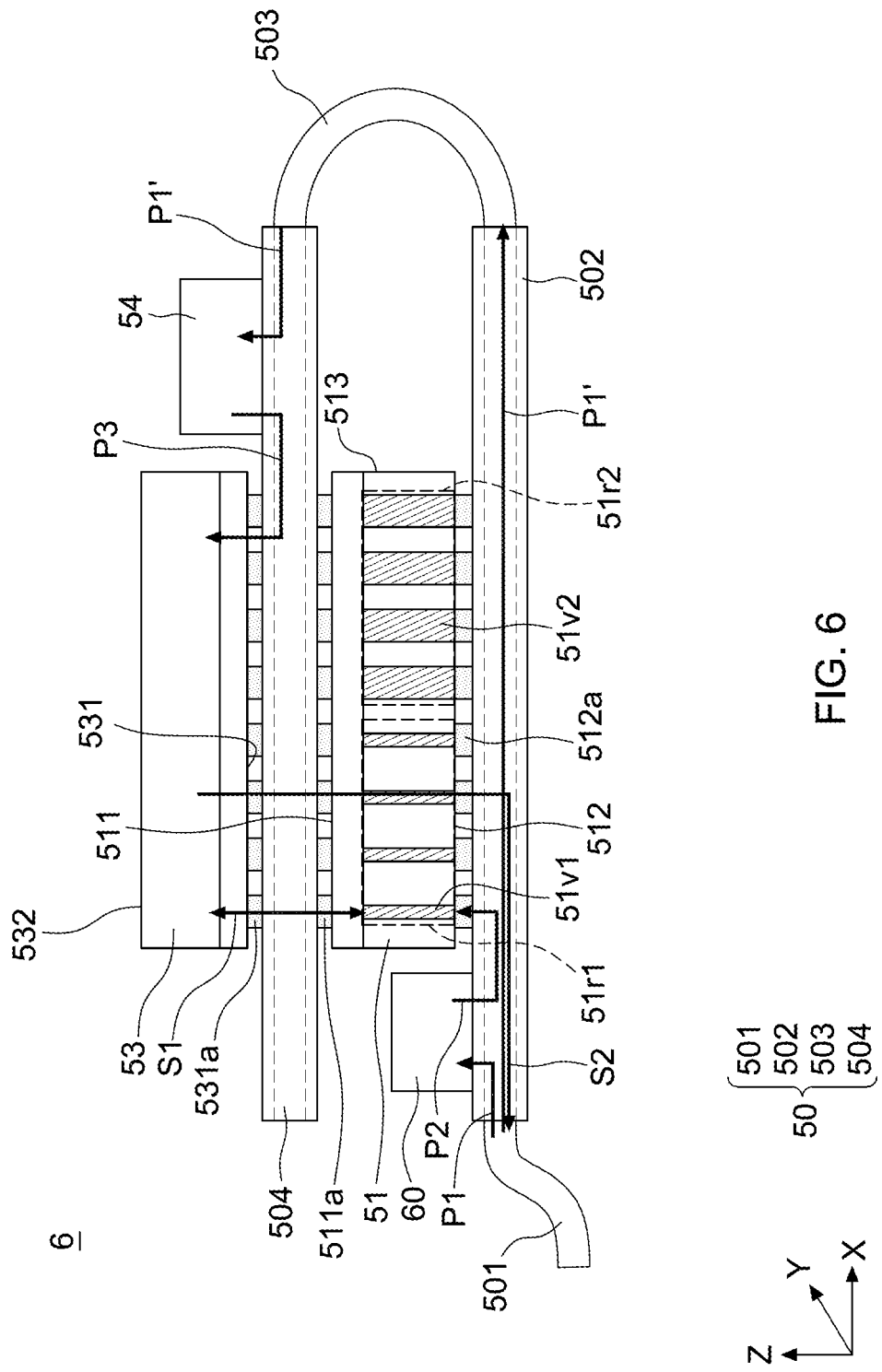
FIG. 6 is a cross-section of an exemplary electronic device according to some embodiments of the present disclosure.

FIG. 6 is a cross-section of an exemplary electronic device 6 according to some embodiments of the present disclosure. The electronic device 6 is similar to the electronic device 5 in FIG. 5A, with differences therebetween as follows.

The power regulating device 52 in the electronic device 5 is replaced with the power regulating device 60. The power regulating device 60 may be disposed closer to a power source (which may be connected with the portion 501) than the electronic component 51.

The power regulating device 60 may be configured to receive a power signal from a power source through the portions 501 and 502, as indicated by the power path "P1." The power regulating device 60 may regulate the power signal and provide a regulated power signal to the electronic component 51 through the portion 502, as indicated by the power path "P2."

In some embodiments, since the I/O pins of the power regulating device 60 are closer to the portion 501 than the I/O pins of the electronic component 51, the power paths P1 and P2 may be closer to the electronic component 51 and the power regulating device 52 than the non-power path S2 along the Z-axis. In other words, the power paths P1 and P2 may be arranged above the non-power path S2 along the Z-axis to reduce power transmission distance. However, in some other embodiments, the non-power path S2 may be arranged above the power paths P1 and P2 to reduce non-power transmission distance.

In some embodiments, the power regulating device 60 and the power regulating device 54 may not overlap to facilitate heat dissipation.

Figure 7:
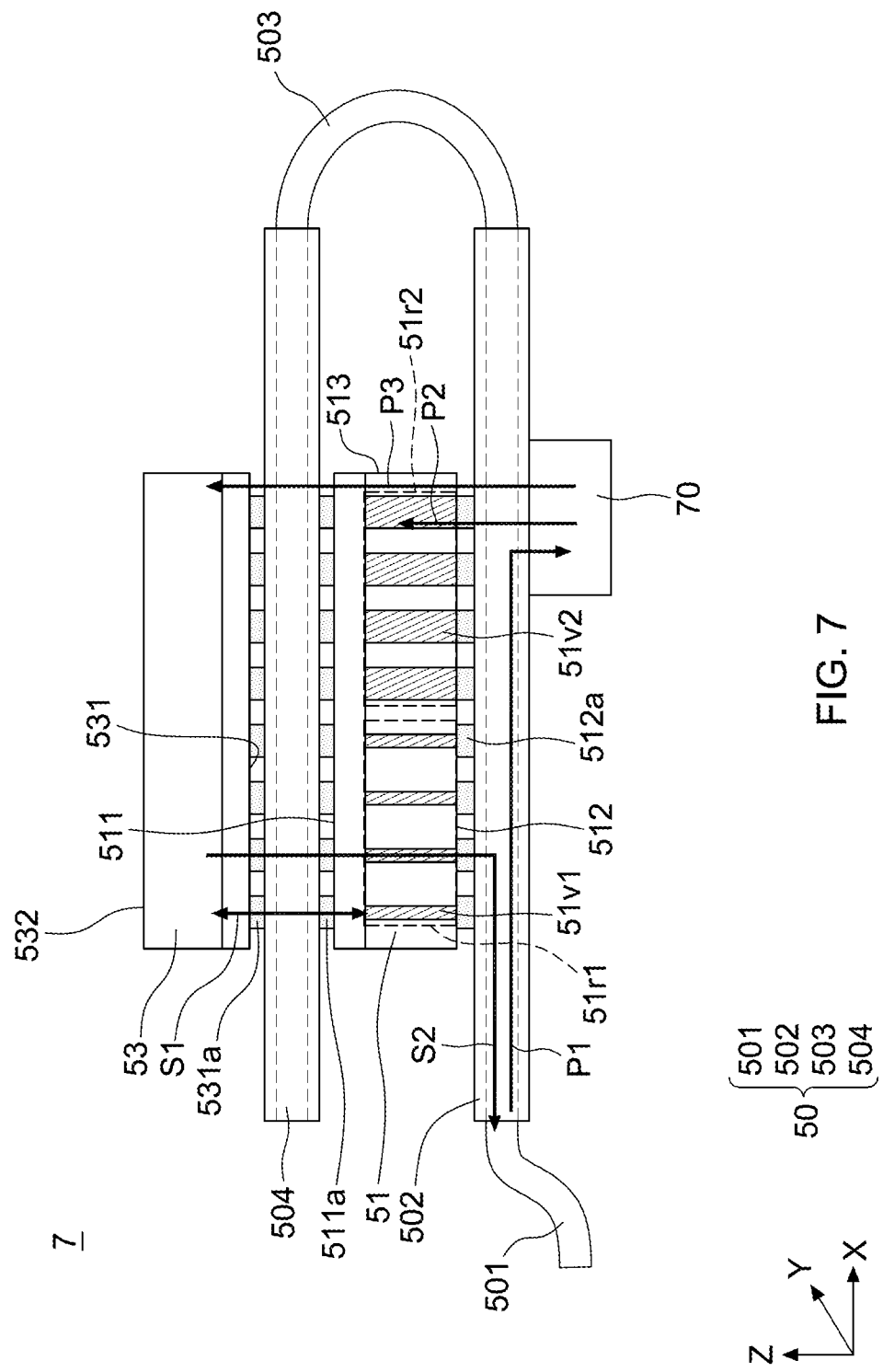
FIG. 7 is a cross-section of an exemplary electronic device according to some embodiments of the present disclosure.

FIG. 7 is a cross-section of an exemplary electronic device 7 according to some embodiments of the present disclosure. The electronic device 7 is similar to the electronic device 5 in FIG. 5A, with differences therebetween as follows.

The power regulating devices 52 and 54 in the electronic device 5 are replaced with the power regulating device 70. The power regulating device 70 may be disposed on the portion 502. The power regulating device 70 and the electronic component 51 may be disposed on the opposite sides or opposite surfaces of the portion 502.

The power regulating device 70 may be configured to receive a power signal from a power source through the portions 501 and 502, as indicated by the power path "P1." The power regulating device 70 may regulate the power signal and provide a regulated power signal to the electronic component 51 through the portion 502, as indicated by the power path "P2."

In addition, the power regulating device 70 may regulate the power signal and provide a regulated power signal to the electronic component 53 through the portion 502, the electronic component 51 and the portion 504, as indicated by the power path "P3." Alternatively or additionally, the power regulating device 70 may regulate the power signal and provide a regulated power signal to the electronic component 53 through the portion 502, the portion 503 and the portion 504.

In some embodiments, the power regulating device 70, the electronic component 51, and the electronic component 53 may be at least partially overlapped to reduce power transmission distance.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic device, comprising:
a carrier including a first portion, a second portion over the first portion and a third portion connecting the first portion and the second portion;
a first electronic component disposed between the first portion and the second portion, wherein an active surface of the first electronic component faces the second portion; and
a second electronic component disposed over the second portion,
wherein the first portion is configured to transmit a first power signal to a backside surface of the first electronic component opposite to the active surface.

2. The electronic device of claim 1, wherein the third portion extends from an elevation lower than the backside surface of the first electronic component to an elevation higher than the active surface of the first electronic component, and laterally covers a lateral surface of the first electronic component.

3. The electronic device of claim 2, wherein the third portion is configured to prevent the first electronic component from an electromagnetic interference (EMI).

4. The electronic device of claim 1, wherein the second electronic component is configured to receive a second power signal through the second portion.

5. The electronic device of claim 4, wherein the second power signal is transmitted from the first electronic component.

6. The electronic device of claim 4, wherein the second power signal is transmitted from the third portion.

7. The electronic device of claim 6, further comprising:
a power regulating device disposed over the second portion, the power regulating device configured to regulate a third power signal from the third portion and generate the second power signal.

8. The electronic device of claim 1, wherein the second portion is configured to provide a first non-power path between the first electronic component and the second electronic component, wherein the second electronic component is disposed over the first electronic component.

9. The electronic device of claim 8, wherein the first portion is configured to provide a second non-power path between the electronic device and an external device.

10. The electronic device of claim 1, wherein a Young's modulus of the first portion and a Young's modulus of the second portion are both greater than a Young's modulus of the third portion.

11. The electronic device of claim 10, wherein a thickness of the third portion is respectively less than a thickness of the first portion and a thickness of the second portion.

12. An electronic device, comprising:
a carrier including a first portion, a second portion over the first portion and a third portion connecting the first portion and the second portion; and
a first electronic component disposed between the first portion and the second portion and disposed on a side of the third portion;
wherein the first electronic component comprises a first region and a second region between the first region and the third portion; and
wherein the first region is configured to provide a non-power path between the first electronic component and an external device, and the second region is configured to provide a power path.

13. The electronic device of claim 12, further comprising:
a power regulating device connecting to the first portion and configured to regulate a power signal from the first portion and generate a regulated power signal to the power path provided by the second region of the first electronic component.

14. The electronic device of claim 13, wherein the power regulating device is between the third portion and the second region of the first electronic component.

15. The electronic device of claim 12, further comprising:
a second electronic component disposed over the second portion, wherein the second electronic component and the first portion are communicated through the non-power path provided by the first region of the first electronic component.

16. The electronic device of claim 12, wherein the first portion comprises a first end connected to the third portion and a second end connected to a fourth portion, and wherein a non-power signal passing through a backside surface of the electronic component is transmitted to an external device through the first portion and the fourth portion.

17. The electronic device of claim 16, wherein the first portion comprises an upper portion and a lower portion, and wherein the upper portion includes a first wiring structure for a non-power signal and the lower portion includes a second wiring structure for a power signal.

18. An electronic device, comprising:
- a carrier including a first rigid portion, a second rigid portion over the first rigid portion and a flexible portion connecting between the first rigid portion and the second rigid portion;
- a first electronic component disposed between the first rigid portion and the second rigid portion, wherein a backside surface of the first electronic component faces the first rigid portion; and
- a second electronic component disposed over the second rigid portion;
- wherein the first rigid portion is configured to transmit a first power signal and to transmit a second power signal to the backside surface of the first electronic component, the second power signal being generated by regulating the first power signal; and
- wherein the second rigid portion is configured to transmit a third power signal and to transmit a fourth power signal to the second electronic component, the fourth power signal being generated by regulating the third power signal.

19. The electronic device of claim 18, wherein the third power signal is transmitted from the first rigid portion and transmitted through the flexible portion.

20. The electronic device of claim 18, further comprising:
- a first power regulating device disposed over the first rigid portion and disposed between the first electronic component and the flexible portion; and
- a second power regulating device disposed over the second rigid portion and disposed over the first power regulating device.

* * * * *